United States Patent
Lu et al.

(10) Patent No.: US 7,881,095 B2
(45) Date of Patent: Feb. 1, 2011

(54) ASYMMETRIC WRITE CURRENT COMPENSATION USING GATE OVERDRIVE FOR RESISTIVE SENSE MEMORY CELLS

(75) Inventors: Yong Lu, Edina, MN (US); Harry Hongyue Liu, Maple Grove, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 211 days.

(21) Appl. No.: 12/269,630

(22) Filed: Nov. 12, 2008

(65) Prior Publication Data
US 2010/0034009 A1    Feb. 11, 2010

Related U.S. Application Data

(60) Provisional application No. 61/087,200, filed on Aug. 8, 2008.

(51) Int. Cl.
*G11C 11/00* (2006.01)
(52) U.S. Cl. .................. 365/148; 365/210.11; 365/203; 365/100
(58) Field of Classification Search .................. 365/148, 365/210.11, 203, 100
See application file for complete search history.

(56) References Cited

U.S. PATENT DOCUMENTS

| 7,161,861 B2 | 1/2007 | Gogl et al. |
| 7,345,912 B2 | 3/2008 | Luo et al. |
| 7,414,908 B2 | 8/2008 | Miyatake et al. |
| 2010/0067281 A1* | 3/2010 | Xi et al. .................. 365/148 |

* cited by examiner

*Primary Examiner*—Thong Q Le
(74) *Attorney, Agent, or Firm*—Fellers, Snider, et al.

(57) ABSTRACT

Apparatus and associated method for asymmetric write current compensation for resistive sense memory (RSM) cells, such as but not limited to spin-torque transfer random access memory (STRAM) or resistive random access memory (RRAM) cells. In accordance with some embodiments, an RSM cell includes an RSM element coupled to a switching device. The switching device has a plurality of terminals. A control circuit compensates for asymmetric write characteristics of the RSM cell by limiting a range of voltage differentials across the terminals so as to be equal to or less than a magnitude of a source voltage applied to the switching device, thereby providing bi-directional write currents of substantially equal magnitude through the RSM element.

20 Claims, 5 Drawing Sheets

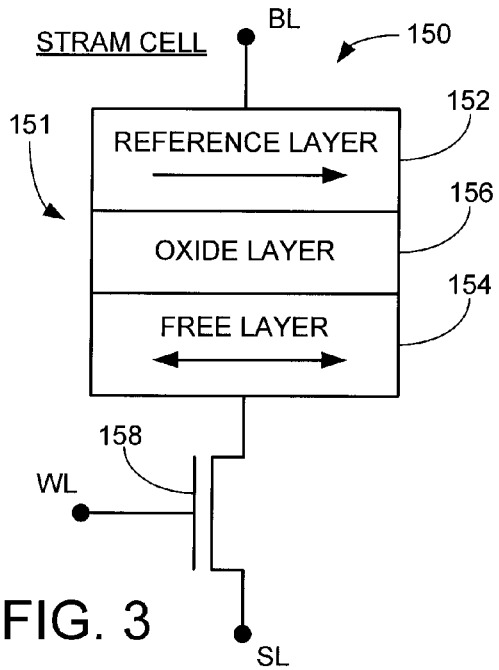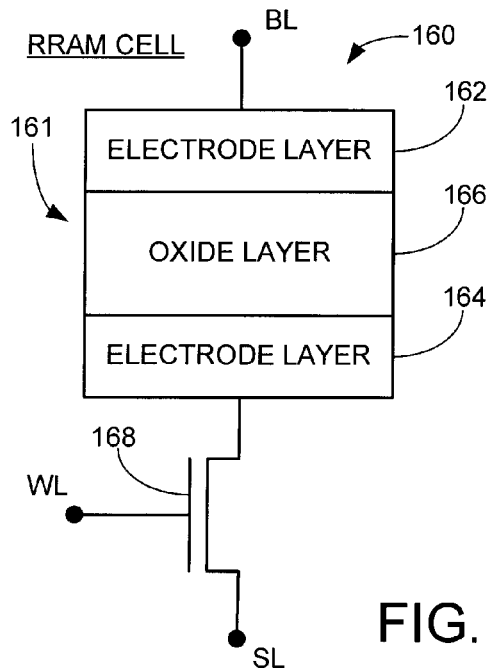
FIG. 3
FIG. 4
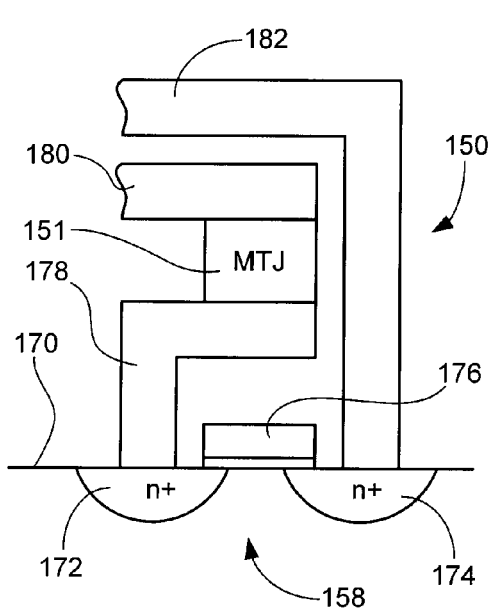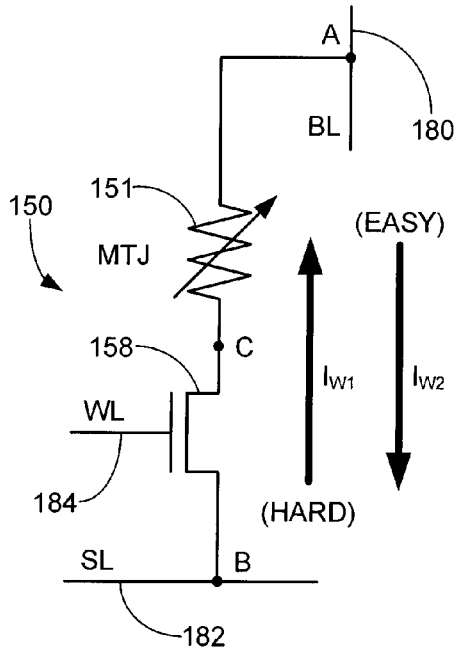
FIG. 5
FIG. 6

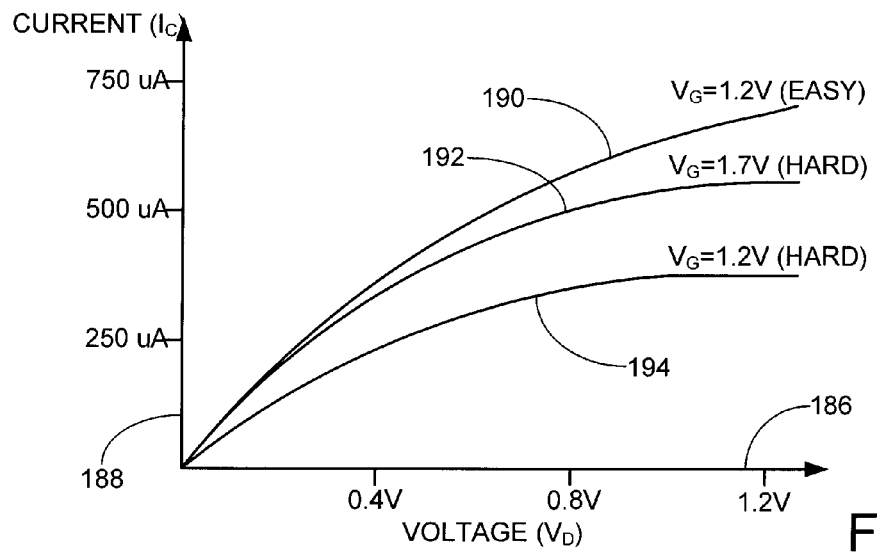
FIG.7
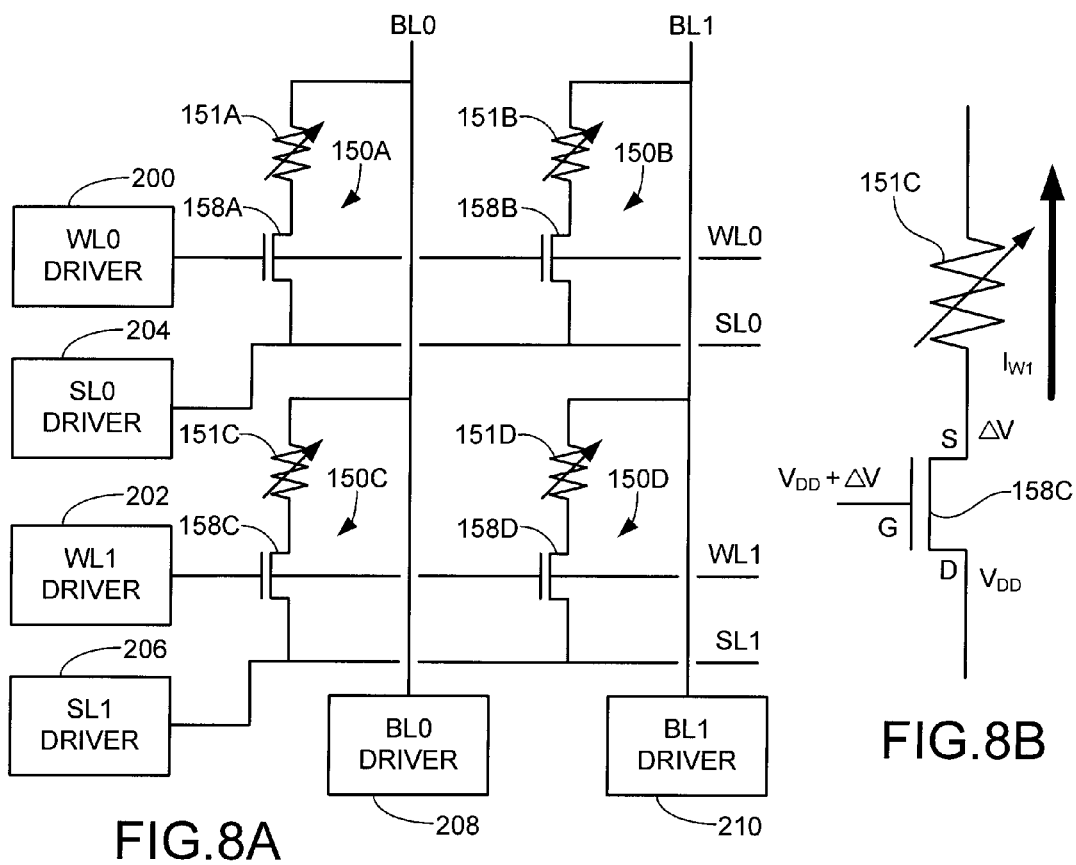
FIG.8A
FIG.8B

ASYMMETRIC WRITE CURRENT COMPENSATION USING GATE OVERDRIVE FOR RESISTIVE SENSE MEMORY CELLS

RELATED APPLICATIONS

This application makes a claim of domestic priority under 35 U.S.C. §119(e) to U.S. Provisional Patent Application No. 61/087,200 filed Aug. 8, 2008.

BACKGROUND

Data storage devices generally operate to store and retrieve data in a fast and efficient manner. Some storage devices utilize a semiconductor array of solid-state memory cells to store individual bits of data. Such memory cells can be volatile or non-volatile. Volatile memory cells generally retain data stored in memory only so long as operational power continues to be supplied to the device. Non-volatile memory cells generally retain data stored in memory even in the absence of the application of operational power.

So-called resistive sense memory (RSM) cells can be configured to have different electrical resistances to store different logical states. The resistance of the cells can be subsequently detected during a read operation by applying a read current and sensing a signal in relation to a voltage drop across the cell. Exemplary types of RSM cells include resistive random access memory (RRAM), magnetic random access memory (MRAM), and spin-torque transfer random access memory (STTRAM or STRAM).

SUMMARY

Various embodiments of the present invention are generally directed to an apparatus and associated method for asymmetric write current compensation for resistive sense memory (RSM) cells, such as but not limited to spin-torque transfer random access memory (STRAM) or resistive random access memory (RRAM) cells.

In accordance with some embodiments, an apparatus generally comprises an RSM cell having an RSM element coupled to a switching device. The switching device comprises a plurality of terminals. A control circuit compensates for asymmetric write characteristics of the RSM cell by limiting a range of voltage differentials across said terminals to be equal to or less than a magnitude of a source voltage applied to the switching device to provide bi-directional write currents of substantially equal magnitude through the RSM element.

In accordance with further embodiments, an apparatus generally comprises a resistive sense memory (RSM) cell comprising an RSM element coupled to a switching device, the switching device comprising a plurality of terminals, and first means for compensating for asymmetric write characteristics of the RSM cell by limiting a range of voltage differentials across said terminals to be equal to or less than a source voltage applied to one of said terminals to provide bi-directional write currents of substantially equal magnitude through the RSM element.

In accordance with still further embodiments, a method generally comprises providing a resistive sense memory (RSM) cell comprising an RSM element coupled to a switching device, and compensating for asymmetric write characteristics of the RSM cell. Such compensation generally includes pre-charging a first control line to a source voltage, and applying a first gate control voltage to the switching device to pass a first write current from the pre-charged first control line, through the switching device and to the RSM element to program a first resistive state, the first gate control voltage selected to be greater than the source voltage by a delta voltage value equal to a voltage drop across the RSM element.

These and various other features and advantages which characterize the various embodiments of the present invention can be understood in view of the following detailed discussion in view of the accompanying drawings.

BRIEF DESCRIPTION OF THE DRAWINGS

FIG. 3 shows an exemplary construction of a resistive sense memory (RSM) cell characterized as a spin-torque transfer random access memory (STTRAM or STRAM) cell.

FIG. 4 shows an exemplary construction of a resistive sense memory (RSM) cell characterized as a resistive random access memory (RRAM) cell.

FIG. 5 sets forth a side elevational representation of the STRAM cell of FIG. 3.

FIG. 6 is a schematic depiction of the STRAM cell of FIG. 5.

FIG. 7 graphically illustrates different gate voltage characteristics during different write operations upon the STRAM cell of FIG. 6.

FIG. 8A is a functional representation of a portion of an array of STRAM cells in accordance with various embodiments of the present invention.

FIG. 8B shows one of the cells of FIG. 8A in greater detail during a hard write operation.

DETAILED DESCRIPTION

Figure 1:
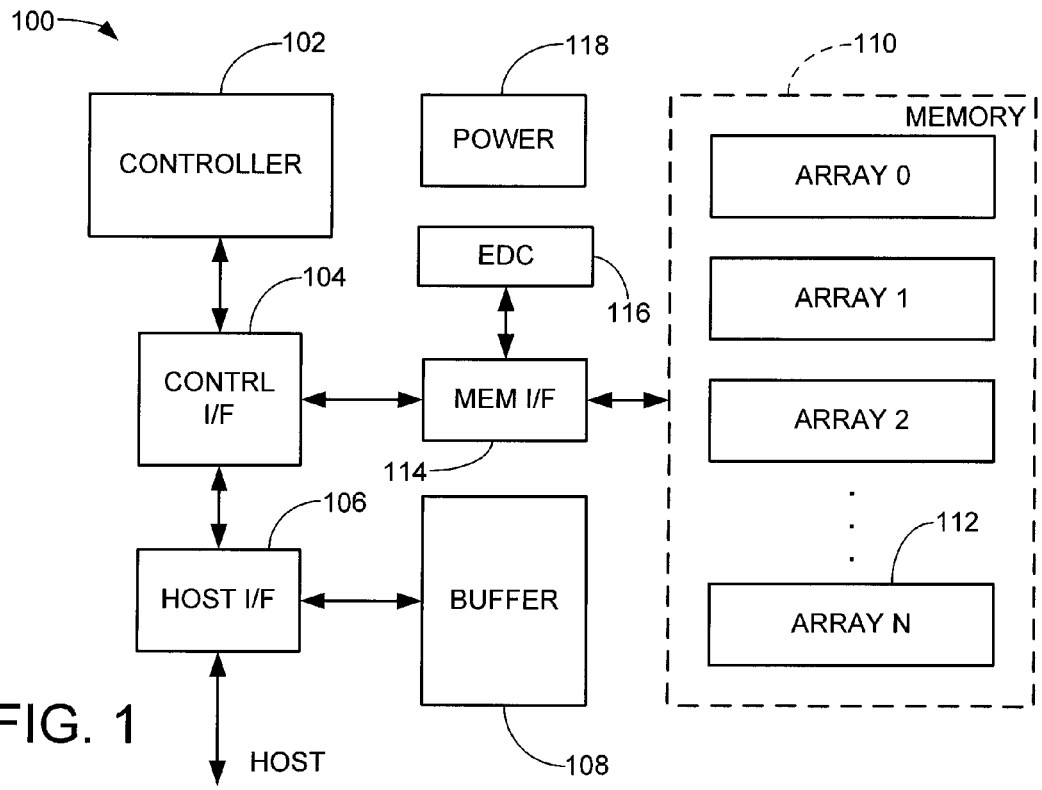
FIG. 1 is a generalized functional representation of an exemplary data storage device constructed and operated in accordance with various embodiments of the present invention.

FIG. 1 provides a functional block representation of a data storage device 100 constructed and operated in accordance with various embodiments of the present invention. The data storage device is contemplated as comprising a portable non-volatile memory storage device such as a PCMCIA card or USB-style external memory device. It will be appreciated, however, that such characterization of the device 100 is merely for purposes of illustration and is not limiting to the claimed subject matter.

Top level control of the device 100 is carried out by a suitable controller 102, which may be a programmable or hardware based microcontroller. The controller 102 communicates with a host device via a controller interface (I/F) circuit 104 and a host I/F circuit 106. Local storage of requisite commands, programming, operational data, etc. can be carried out using a buffer 108. As desired, the buffer 108 operates as a cache to temporarily store input write data from the host device and readback data pending transfer to the host device, as well as to facilitate serialization/deserialization of the data during a transfer operation. The buffer can be located in any suitable location, including in a portion of the array.

A memory space is shown at 110 to comprise a number of memory arrays 112 (denoted Array 0-N). A single array 112 can be utilized as desired. Each array 112 preferably comprises a block of semiconductor memory of selected storage capacity. Communications between the controller 102 and the memory space 110 are coordinated via a memory interface (MEM I/F) 114. On-the-fly error detection and correction (EDC) encoding and decoding operations can be carried out during data transfers by way of an EDC block 116.

While not limiting, in an embodiment the various circuits depicted in FIG. 1 are arranged as a single chip set formed on one or more semiconductor dies with suitable encapsulation, housing and interconnection features (not separately shown for purposes of clarity). Input power to operate the device is handled by a suitable power management circuit 118 and is supplied from a suitable source such as from a battery, AC power input, etc. Power can also be supplied to the device 100 from the host.

Any number of data storage and transfer protocols can be utilized, such as logical block addressing (LBAs) whereby data are arranged and stored in fixed-size blocks (such as 512 bytes of user data plus overhead bytes for ECC, sparing, header information, etc). Host commands can be issued in terms of LBAs, and the device 100 can carry out a corresponding LBA-to-PBA (physical block address) conversion to identify and service the associated locations at which the data are to be stored or retrieved.

Figure 2:
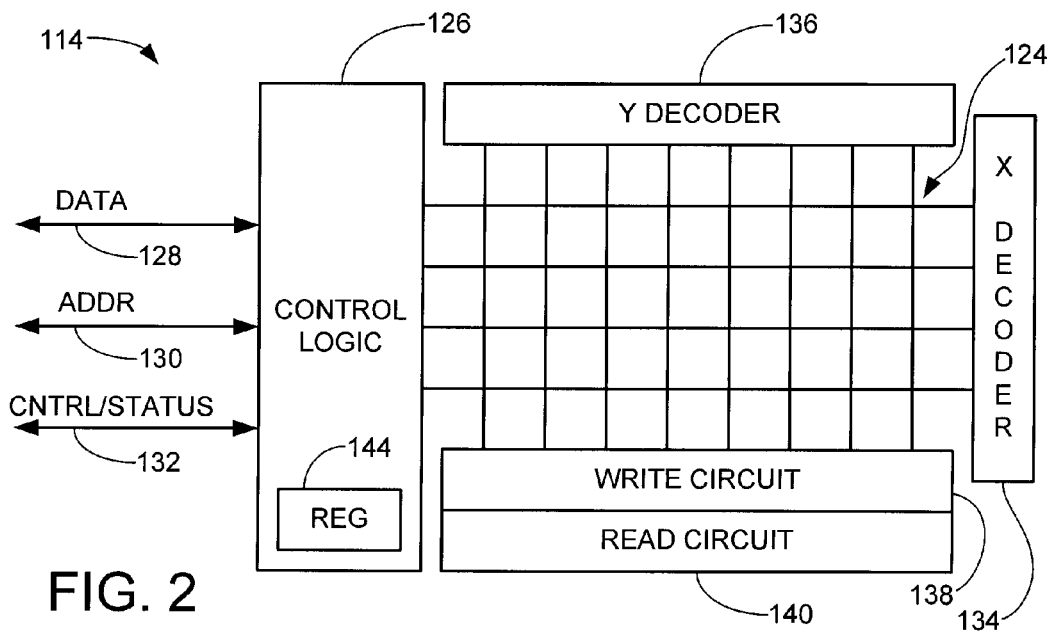
FIG. 2 shows circuitry used to read data from and write data to a memory array of the device of FIG. 1.

FIG. 2 provides a representation of selected aspects of the memory space 110 of FIG. 1. Data are stored in each array as an arrangement of rows and columns of memory cells 124, accessible by various row (word) and column (bit) lines, etc. The actual configurations of the cells and the access lines thereto will depend on the requirements of a given application. The various control lines can include enable lines that selectively enable and disable the respective writing and reading of the value(s) of the individual cells.

Control logic 126 receives and transfers data, addressing information and control/status values along multi-line bus paths 128, 130 and 132, respectively. X and Y decoding circuitry 134, 136 provide appropriate switching and other functions to access the appropriate cells 124. As desired, adjacent arrays can be configured to share a single Y (row) decoder 136 to reduce RC delay effects along an associated word line.

A write circuit 138 represents circuitry elements that operate to carry out write operations to write data to the cells 124, and a read circuit 140 correspondingly operates to obtain readback data from the cells 124. Local buffering of transferred data and other values can be provided via one or more local registers 144. At this point it will be appreciated that the circuitry of FIG. 2 is merely exemplary in nature, and any number of alternative configurations can readily be employed as desired depending on the requirements of a given application.

The memory cells 124 are characterized as so-called resistive sense memory (RSM) cells. As used herein, RSM cells are generally described as cells configured to have different electrical resistances which are used to store different logical states. The resistance of the cells can be subsequently detected during a read operation by applying a read current and sensing a signal in relation to a voltage drop across the cell. Exemplary types of RSM cells include resistive random access memory (RRAM), magnetic random access memory (MRAM), spin-torque transfer random access memory (STTRAM or STRAM), etc.

Advantages of RSM cells over other types of non-volatile memory cells such as EEPROM and flash include the fact that no floating gate is provided in the cell construction. No erase operation is necessary prior to the writing of new data to an existing set of cells. Rather, RSM cells can be individually accessed and written to any desired logical state (e.g., a "0" or "1") irrespective of the existing state of the RSM cell. Also, write and read power consumption requirements are substantially reduced, significantly faster write and read times can be achieved, and substantially no wear degradation is observed as compared to erasable cells, which have a limited write/erase cycle life.

FIG. 3 shows an exemplary STRAM cell 150. The STRAM cell 150 includes a magnetic tunneling junction (MTJ) 151 formed from two ferromagnetic layers 152, 154 separated by an oxide barrier layer 156 (such as magnesium oxide, MgO). The resistance of the MTJ 151 is determined in relation to the relative magnetization directions of the ferromagnetic layers 152, 154: when the magnetization is in the same direction (parallel), the MTJ is in the low resistance state ($R_L$); when the magnetization is in opposite directions (anti-parallel), the MTJ is in the high resistance state ($R_H$).

In some embodiments, the magnetization direction of the reference layer 152 is fixed by coupling the reference layer to a pinned magnetization layer (e.g., a permanent magnet, etc.). The magnetization direction of the free layer 154 can be changed by passing a driving current polarized by magnetization in the reference layer 152.

To read the logic state stored by the MTJ 151, a relatively small current is passed through the MTJ between a source line (SL) and a bit line (BL). Because of the difference between the low and high resistances of the MTJ in the respective logical 0 and 1 states, the voltage at the bit line will be different, which can be sensed using a suitable sense amplifier. A switching device 158 allows selective access to the MTJ 151 during read and write operations. In some embodiments, the switching device 158 is characterized as an NMOS field effect transistor (FET). A word line (WL) is connected to a gate terminal of the FET 158, as shown.

FIG. 4 illustrates an exemplary RRAM cell 160 as an alternative RSM cell construction. The RRAM cell 160 includes a variable resistive element 161 formed of opposing electrode layers 162, 164 and an oxide layer 166 formed of a suitable material, such as magnesium oxide MgO. The oxide layer 166 may be configured to have a nominally high resistance $R_H$. The resistance of the oxide layer can be lowered to a low resistance $R_L$ through application of a relatively high write voltage across the RRAM cell 160. Such voltage generates lower resistance paths (filaments) as components of a selected electrode layer 162, 164 migrate into the oxide layer 176.

The oxide layer 166 can be restored to its original, higher resistance through application of a corresponding voltage of opposite polarity. As with the STRAM cell 150 of FIG. 3, the storage state of the RRAM cell 160 of FIG. 4 can be read by passing a read current from a source line (SL) to a bit line (BL), and sensing the resistance of the cell in relation to the voltage drop across the cell. A switching device 168 (NMOS-FET) facilitates access to the RRAM cell.

FIG. 5 provides an elevational representation of an exemplary construction for the STRAM cell 150 of FIG. 3. FIG. 5 shows a base semiconductor layer 170 in which localized regions 172, 174 of n+ doped material are formed. An isolated control gate 176 spans the respective regions 172, 174 to form the switching transistor 158 (FIG. 3). A word line WL (not separately shown) connects the control gate 176 to control gates of other cells across the associated array.

At this point it will be appreciated that the doped regions 172, 174 can be alternately designated as the so-called drain and source of the transistor 158, depending on the direction of current flow through the device. As those skilled in the art will recognize, in FET structures such as 158 electrons flow from source to drain, and the corresponding current flows from drain to source. Thus, when the current flows through the transistor 158 in a first direction toward the region 172, the region 172 will be identified as the source and the region 174 will be identified as the drain. Contrawise, when the current flows through the transistor 158 in an opposite, second direction, the region 172 will be identified as the drain and the region 174 will constitute the source. This clarification of terminology may be helpful in the discussion below.

Continuing with FIG. 5, a support structure 178 extends upwardly from the region 172 to support the MTJ 151. A bit line BL 180 is coupled to the MTJ 151 opposite the support structure 178, and a source line SL 182 is coupled to the region 174 of transistor 158. It will be appreciated that the structural configuration of FIG. 5 is merely exemplary in nature, and is not limiting in that any number of alternative configurations can be utilized. For example, an embodiment of the RRAM cell 160 in FIG. 4 can be similar to the structure of FIG. 5, with the support structure 178 supporting the layers 162, 164 and 166 of the resistive sense element 161.

In some embodiments, a 70 nm or smaller fabrication process technology is used, and each cell generally obtains a size on the order of about 4 $F^2$. In other embodiments, existing analogous fabrication technologies and layouts are used (as modified to accommodate an RSM cell), such as DRAM, embedded DRAM (eDRAM), etc. As noted above, this provides a significant improvement from an overall footprint size as compared to existing technologies, such as multi-transistor SRAM based cells.

As will be recognized, STRAM has a number of advantages including the ability to use significantly lower write current magnitudes as compared to other types of memory cells, such as traditional spin valve and pseudo-spin valve based MRAM. The single transistor/single MTJ element configuration of FIG. 5 provides enhanced scalability and enables relatively straightforward read and write operations.

Nevertheless, one issue that has been found with STRAM cells (as well as with other types of RSM cells) relates to the minimal achievable sizing of the cell transistor (e.g., device 158). Generally, it is desirable to ensure that the cell transistor is configured to be large enough to be able to accommodate the requisite write current densities and gate control voltages necessary to carry out write operations without incurring damage to the cell transistor. At the same time, since the transistor can often be the limiting factor in cell scalability, reducing the size of the transistor can promote increases in the overall density of the memory array.

A related matter is write current asymmetry. STRAM cells are often configured such that write currents are passed in different directions through the cell in order to write the different logical states. This can also be true for other types of RSM cells. For example, application of a write current in a first direction (e.g., from 182 to 180 in FIG. 5) may set the resistance of the cell low, thereby signifying a first logical state (e.g., logical 0). Application of a write current in the opposite second direction (e.g., from 180 to 182 in FIG. 5) may set the resistance of the cell high, thereby signifying the opposite logical state (e.g., logical 1).

Depending on the configuration of the cell, it may be harder to write the cell in one direction as compared to the other. A number of factors can contribute to such asymmetry. One factor relates to the relative ordering of the MTJ 151 and transistor 158 elements with respect to the direction of the applied write current; that is, whether the write current passes through the MTJ first, or passes through the transistor first. Other factors can relate to the configuration and ordering of layers within the MTJ 151 (or other variable resistive element).

For the exemplary cell 150 of FIG. 5, it is contemplated that it will be relatively easy to write the state of the MTJ 151 when the current is passed in a direction such that the write current encounters the MTJ prior to the transistor 158 (this direction is referred to as a so-called "easy" direction). Contrawise, it is contemplated that it will be more difficult to write in the opposite direction when the write current passes through the transistor (drain-source juncture) prior to encountering the MTJ (this direction is referred to as a so-called "hard" direction).

Accordingly, as explained below, various embodiments of the present invention utilize a novel control technique to facilitate the use of a higher gate voltage when writing in a hard direction as compared to writing in an easy direction. This provides substantial symmetry in the writing operation, irrespective of write current direction. A number of advantageous benefits are achieved, including the ability to size the cell transistors according to the smaller easy direction, which promotes increased memory array densities.

Reference is now made to FIG. 6, which provides a schematic depiction of the STRAM cell 150 of FIG. 5. In FIG. 6, the MTJ 151 is depicted as a variable resistor in series with the switching element (transistor) 158. The bit line 180 is coupled to one end of the cell 150 adjacent the MTJ 151. This connection point is designated as node A. The source line 182 is coupled to the other end of the cell 150 adjacent the transistor 158 (node B). A third node (node C) is identified between the MTJ 151 and the transistor 158. The aforementioned word line WL is denoted as 184 and is coupled to the gate of the transistor 158 as shown.

FIG. 6 further shows two respective write currents, $I_{W1}$ and $I_{W2}$. The first write current $I_{W1}$ denotes a write operation in the hard direction. The $I_{W1}$ current passes from the source line SL 182 (node B) and across the drain-source junction (e.g., from drain region 174 to source region 172 in FIG. 5) of the transistor 158 prior to reaching the MTJ cell 151. The second write current $I_{W2}$ represents a write operation in the easy direction. The $I_{W2}$ current passes immediately from the bit line BL 180 (node A) to the MTJ 151, and then through the transistor 158 (drain region 172 to source region 174 in FIG. 5) to the source line SL 182.

At this point it may not be immediately apparent why the direction of writing would impart asymmetry to the write effort; after all, the transistor 158 remains serially connected with the MTJ 151 in both cases, so any resistive or operational effects of the transistor would appear to be constant. For a given source voltage $V_{DD}$ applied to the respective nodes A or B, it would seem that the magnitude of the write current through the cell 150 should be substantially the same, irrespective of write current direction. The respective voltage drops across the MTJ and the transistor should also be nominally the same in both current directions.

This overlooks real world effects that have been observed related to the operation of the transistor 158, which can affect both the actual magnitude of the voltage presented to the MTJ 151, as well as the magnitude of current that can be applied for a given source voltage. If the source voltage $V_{DD}$ is applied to the bit line BL 180 (node A), this entire magnitude of voltage is substantially applied directly to the MTJ 151. By contrast, if the voltage $V_{DD}$ is applied to the source line SL 182 (node B), the voltage presented to the MTJ 151 (node C) will generally be $V_{DD} - V_{DS}$, where $V_{DS}$ is the voltage drop across the drain-source juncture of the transistor 158. While the value of the voltage drop $V_{DS}$ in the active region may be relatively low (e.g., around 0.6V, etc.), it has nevertheless been found that the need to transverse the transistor 158 prior to reaching the MTJ 151 can reduce both applied voltage and current to the MTJ.

FIG. 7 graphically illustrates this asymmetric effect. FIG. 7 provides a number of exemplary I-V plots with a voltage x-axis 186 and a current y-axis 188. The voltage along the x-axis 186 generally corresponds to a drain voltage $V_D$ of the transistor 158, and the current along the y-axis 188 generally corresponds to current $I_C$ through the cell.

A first curve 190 shows the relationship between $V_D$ and $I_C$ for a gate voltage $V_G$ of about 1.2V in the easy direction (e.g., $I_{W2}$ in FIG. 6). Second and third curves 192, 194 show the corresponding relationships for gate voltages of 1.2V and 1.7V in the hard direction (e.g., $I_{W1}$ in FIG. 6). While not shown in FIG. 7, it will be understood that a common source voltage $V_{DD}$ is applied for all curves.

From FIG. 7 it will be observed that the use of the same gate voltage ($V_G$=1.2 V) results in widely varying magnitudes of write current; indeed, the write current magnitude in the easy direction (curve 190) is more than double the magnitude of write current in the hard direction (curve 194) for this same gate voltage. Significantly increasing the gate voltage $V_G$ from 1.2V to 1.7V still fails to achieve the same magnitude of write current (see curves 192, 194).

Historically, proposed solutions to the above asymmetric write effects have included configurations wherein larger gate voltages $V_G$ are used for writes in the hard direction. While operable, this provides a number of disadvantages. First, as those skilled in the art will appreciate, gate voltages cannot simply continue to be increased indefinitely; at some point saturation will occur at which further increases in gate voltage provide little or no further increase in drain-source current. Placing a transistor into saturation can also negatively impact the switching speed of the device, since recovery time due to capacitance and other effects are significantly increased.

The use of larger gate voltages $V_G$ also runs the risk of overdriving and permanently damaging the transistor structure. This can be addressed by increasing the size of the transistor cell, but this in turn runs counter to achieving higher memory array densities.

Accordingly, various embodiments of the present invention generally operate to compensate for asymmetric write characteristics of an RSM cell by limiting a range of voltage differentials across the terminals of the switching device of the cell to a level that is equal to or less than a source voltage which is applied to one of the terminals. This allows provision of bi-directional write currents of substantially equal magnitude through the cell in both the hard and easy directions.

Writing in the hard direction generally involves pre-charging a first control line to a source voltage, followed by applying a first gate control voltage to the switching device. The first gate control voltage enables passage of a first write current from the pre-charged first control line, through the switching device and to the RSM element of the cell to program the RSM element to a first resistive state. The first gate control voltage is selected to be greater than the source voltage by a delta voltage value equal to a voltage drop across the RSM element.

Writing in the easy direction generally involves applying a second gate control voltage to the switching device to pass a second write current from a second control line, through the RSM element and to the switching device to program the RSM element in a second resistive state. The second gate control voltage is less than the first gate control voltage, and the magnitude of the second write current is nominally equal to the magnitude of the first write current.

In some embodiments, the switching device is sized such that the first gate control voltage is sufficient to structurally damage the transistor when the first gate control voltage is applied to the gate without a voltage present at the source or drain. However, the pre-charging of the drain to the source voltage eliminates this risk, allowing the transistor to be sized to the smaller, easy direction size.

An exemplary embodiment is set forth by FIG. 8A to explain the foregoing features and advantages. FIG. 8A illustrates an array of RSM cells as set forth by FIGS. 5-6 arranged into a semiconductor array (such as one of the arrays 112 of FIG. 1). More specifically, FIG. 8A illustrates four STRAM cells denoted 150A-150D, each having an associated MTJ 151A-D and switching device (transistor) 158A-D.

A plurality of control lines are shown in FIG. 8A to include first and second bit lines BL0 and BL1, first and second source lines SL0 and SL1, and first and second word lines WL0 and WL1. It will be appreciated that the array can be extended to have any numbers of columns and rows of such cells, so the simplified 2×2 array in FIG. 8A is merely for purposes of illustration and is not limiting. The various directions of the word, bit and source lines across the array are also merely exemplary and can be oriented as desired.

The cells 150A and 150B are shown to constitute a first row (row 0), and the cells 150C and 150D are shown to constitute a second row (row 1). The cells 150A and 150C are arranged along a first column (column 0), and cells 150B and 150D are arranged along a second column (column 1). The respective gates of transistors 158A and 158B are coupled to the word line WL0 for row 0, and voltages are concurrently provided to these gates by a WL0 driver 200. The gates of transistors 158C and 158D are similarly coupled via the word line WL1 to a WL1 driver 202.

SL0 and SL1 drivers 204, 206 are configured to selectively assert the respective SL0 and SL1 source lines, and BL0 and BL1 drivers 208, 210 are configured to selectively assert the BL0 and BL1 lines. It will be appreciated that the respective BL0 and BL1 drivers 208 and 210 can be further configured to sense resistance levels of the respective cells 150A-D during read operations responsive to read currents provided by the SL0 and SL1 drivers 204, 206.

Exemplary write operations in accordance with various embodiments will now be discussed with reference to a selected cell, in this case RSM cell 150C which is shown in greater detail in FIG. 8B. To write a resistive state of the cell 150C in the hard direction (i.e., through transistor 158C to MTJ 151C), the SL1 driver 206 first operates to pre-charge the source line SL1 to a source voltage $V_{DD}$. The source voltage can be any suitable voltage level used by the array, such as about 3.3V, etc. Pre-charging the source line SL1 in this fashion places the drain (D, FIG. 8A) at substantially this voltage (i.e., $V_D=V_{DD}$).

Once the source line SL1 has been pre-charged, a gate control voltage ($V_G$) is asserted on the WL1 word line by the WL1 driver 202, and the bit line BL0 is connected by the BL0 driver 208 to ground (or other suitable reference level). The gate control voltage $V_G$ places the transistor 158C into a drain-source conductive state, facilitating passage of write current $I_{W1}$ through the transistor 158C and to the MTJ 151C. The write current $I_{W1}$ will provide a voltage drop ΔV ("delta-vee" or "delta voltage") across MTJ 151C, wherein ΔV= $(I_{W1})$R with R equal to the combined resistance of the MTJ 151C ($R_{MTJ}$) and transistor 158 ($R_{DS}$).

As shown in FIG. 8B, the gate control voltage $V_G$ will be equal to the source voltage $V_{DD}$ plus the delta voltage value $\Delta V$ (i.e., $V_G=V_{DD}+\Delta V$). Thus, during the hard write operation the voltages at the respective drain, gate and source terminals of the transistor 158C are $V_{DD}$, $V_{DD}+\Delta V$ and $\Delta V$, respectively (or alternatively, $V_{DD}$, $V_{DD}+IR$ and IR, where R is the combined resistance and I is the write current as set forth above). It is noted that the voltage differentials over this range of values is maintained equal to or less than $V_{DD}$, ensuring no overdrive condition of the transistor 158; the delta voltage value $\Delta V$ is necessarily less than $V_{DD}$ because of the forward biased drop across the transistor in the D-S direction. The voltage differential between gate and source is $V_{DD}$, and the voltage differential between gate and drain is $\Delta V$. The additional voltage $\Delta V$ supplied to the gate can be generated in a number of ways, such as via a suitable charge pump, a second (higher) voltage source, etc. (not separately shown).

The gate control voltage $V_G$ in the hard direction (hereinafter $V_{G1}$) is accordingly selected by identifying the desired $\Delta V$ value to be presented to the MTJ 151C, and then setting $V_{G1}$ as the sum of $V_{DD}$ and $\Delta V$. The $\Delta V$ value is further selected to provide substantially the same magnitude of write current through the MTJ 151C in both the hard and easy directions. That is, the pre-charging of the source line prior to the application of the control voltage in the hard direction allows the application of a gate voltage within the range of gate voltage differentials that are used in the easy direction. The gate control voltage in the easy direction ($V_{G2}$) can be set at a lower value than in the hard direction ($V_{G1}$), such as $V_{DD}$, to further substantially ensure equal magnitude write currents. Suitable values for $\Delta V$, $V_{G1}$ and $V_{G2}$ can be empirically derived, as desired.

Referring again to FIG. 8A, the RSM cell 151D shares word and source lines with the RSM cell 151C (i.e., word line WL1 and source line SL1). Accordingly, in some embodiments the bit line B1 for the RSM cell 151D is further pre-charged to the source voltage $V_{DD}$ by the BL1 driver 210 during the pre-charging of the source line SL1 by the SL1 driver 206. Upon assertion of the gate control voltage $V_{G1}$, which is concurrently applied to the gates of both transistors 158C and 158D, no current will flow through the adjacent cell 158D (leaving the existing resistance state of cell 158D intact). More generally, for an array with n cells in each row, during a hard write upon a selected cell the associated bit line is set to ground while the remaining n-1 bit lines for the cells along the row are pre-charged to $V_{DD}$.

Figure 9:
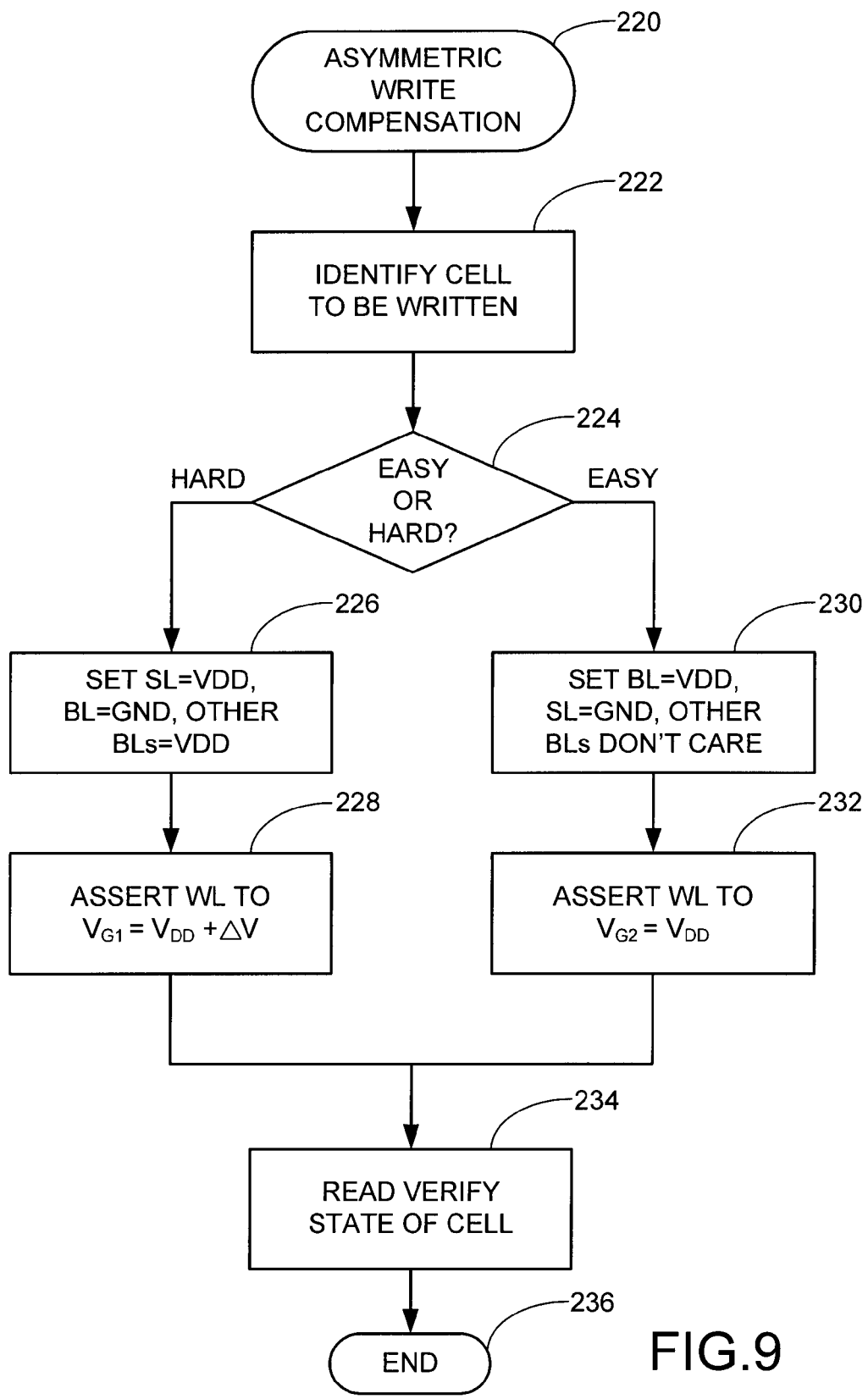
FIG. 9 is a flow chart for a WRITE OPERATION generally illustrative of steps carried out in accordance with various embodiments of the present invention.

FIG. 9 provides a flow chart for an ASYMMETRIC WRITE COMPENSATION routine 220, generally illustrative of steps carried out in accordance with various embodiments of the present invention. At step 202, a particular RSM cell is first identified for which a writing operation is desired to place the cell in a selected resistive state. Control circuitry, such as shown in FIGS. 1-2 and which can include the respective driver circuitry of FIG. 8A, makes a determination at decision step 204 as to whether the requisite write current to achieve the selected resistive state will be in the easy direction or the hard direction (see FIG. 6).

If the hard direction is determined, the flow passes to step 206 in FIG. 9 wherein a first control line (such as the SL1 source line in FIG. 8A) is precharged to a source voltage (such as $V_{DD}$), a second control line (such as the BL0 bit line in FIG. 8A) is set to ground, and a remaining set of control lines (such as the BL1 bit line in FIG. 8A) are also pre-charged to the source voltage.

At step 208, a first gate control voltage (such as $V_{G1}$) is asserted to flow a write current (such as write current $I_{W1}$) from a switching device of the cell (such as transistor 158C in FIGS. 8A and 8B) to an RSM element of the cell (such as MTJ 151C in FIGS. 8A and 8B) to write the desired resistive state thereto. In some embodiments, the first gate control voltage can be expressed as $V_{G1}=V_{DD}+\Delta V$, where $\Delta V$ is the desired voltage drop across the RSM element.

Returning to decision step 204, if the easy direction is determined, the flow alternatively passes to step 210 wherein the aforementioned first control line (e.g., SL0 in FIG. 8A) is set to ground and the second control line (such as BL0 in FIG. 8A) is set to a suitable voltage such as $V_{DD}$. Additional actions can be taken as desired for adjacent cells in the same row or column as the selected cell, such as placing the control lines for these adjacent cells at a state of high impedance, etc. However, because of the respective orientations of control lines in the exemplary array of FIG. 8A, the easy direction write should normally not affect any of the remaining cells.

At step 212, a second gate control voltage (such as $V_{G2}$) is asserted to flow a second write current (such as write current IW2 in FIG. 6) through the RSM element (MTJ 151C) to the switching device (transistor 158C). The second gate control voltage can be any suitable value, such as $V_{G2}=V_{DD}$.

At the conclusion of these respective hard and easy write paths, an optional read verify operation can be carried out to verify the written state of the selected cell, step 214. This can be carried out on the cell 158C, for example, by supplying a suitable read current to source line SL1, asserting word line WL1 and sensing the voltage level of bit line B1 (using a sense amplifier or other technique). The routine is then shown to end at step 216, although it will be appreciated that the routine can be repeated as required to write any number of bits in an associated array.

The routine of FIG. 9 provides substantially the same voltage drops across, and magnitudes of write current through, a selected RSM element during writing in both the hard and easy directions. In the hard direction, the voltage drop across the MTJ is $\Delta V$. In the easy direction, the voltage drop across the MTJ is $V_{DD}-V_{DS}$. But since $V_{DS}$ in the easy direction will be substantially equal to $V_{DD}-\Delta V$ in the hard direction, the voltage drop across the MTJ in the easy direction will also be substantially equal to $\Delta V$.

Accordingly, the RSM cell transistors can each be sized so as to accept nominal gate-drain voltages $V_{GD}$ of no more than the source voltage $V_{DD}$, and this constraint is not violated in either the easy or hard directions. This constraint is not violated in the easy direction because a gate voltage $V_{G2}$ of no greater than $V_{DD}$ need be applied to the gate. This constraint is not violated in the hard direction because, as noted above, the pre-charging of the drain to $V_{DD}$ allows an otherwise "overdrive" gate voltage of $V_{G1}=V_{DD}+\Delta V$ to be applied. Even though the gate is being overdriven, the actual gate-drain differential $V_{GD}$ is only $\Delta V$ (which is less than $V_{DD}$) and no damage to the transistor is incurred. Relatively small transistor sizing can accordingly be used, including but not limited to 4 $F^2$.

Figure 10:
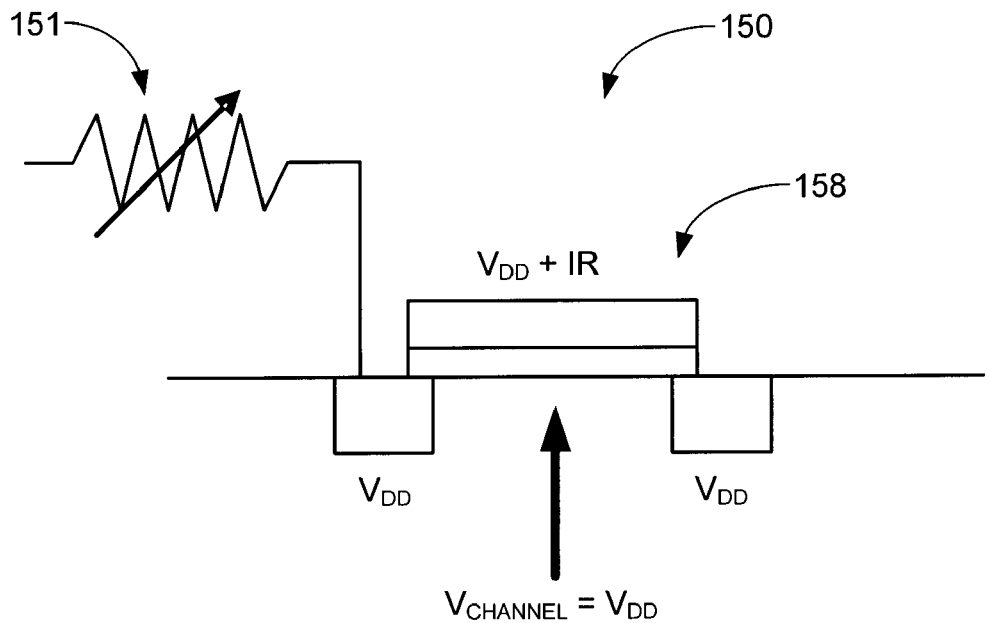
FIG. 10 is a schematic depiction of an exemplary memory cell in a selected condition.
Figure 11:
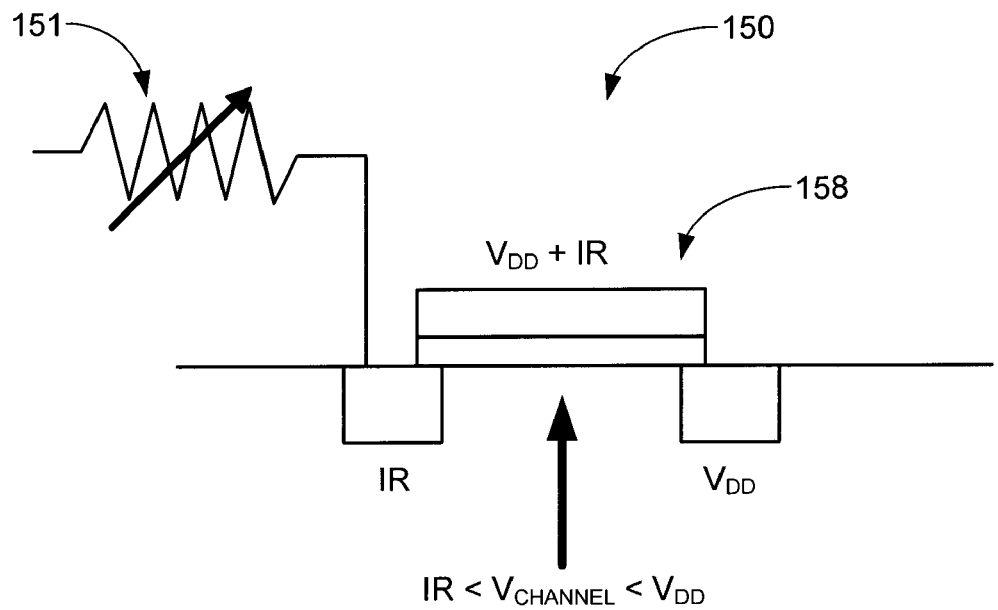
FIG. 11 is a schematic depiction of an exemplary memory cell in a partially selected condition.

These advantages are illustrated by FIGS. 10 and 11. Both of these figures show exemplary RSM cells 150 with MTJs 151 and NMOS transistors 158. The transistor 158 in FIG. 10 is in a selected condition; that is, the cell is configured for a write operation in the hard direction. This is carried out by asserting both the word line (WL) and the bit line (BL), as discussed above.

The transistor 158 in FIG. 11 is in a partially selected condition; that is, the word line (WL) is asserted and the bit line (BL) is in a floating condition. FIG. 10 can thus be viewed as corresponding to the aforedescribed hard write operation on the cell 150C in FIG. 8A, and FIG. 11 can be viewed as corresponding to the adjacent cell 150D in FIG. 8A during the hard write operation on cell 150C.

Both the selected device in FIG. 10 and the partially selected device in FIG. 11 are "on" in that an inversion channel is formed in each device under the associated gate terminal. The channel potential $V_{CHANNEL}$, however, is controlled by the relative magnitudes of voltage present at the respective drain, gate and source of each device, and not the voltage of the transistor body $V_{BODY}$.

For the selected transistor 158 in FIG. 10, the respective drain, gate and source voltages are $V_{DD}$, $V_{DD}$+IR (i.e., $V_{DD}$+ $\Delta V$), and IR (i.e., $\Delta V$). I is the write current through the cell, and R is the combined resistance of the MTJ 151 and resistor 158. The channel potential $V_{CHANNEL}$ will be between the drain and source voltages (i.e., IR<$V_{CHANNEL}$<$V_{DD}$). The body voltage $V_{BODY}$ will be substantially zero.

For the partially selected transistor 158 in FIG. 11, the respective drain, gate and source voltages are $V_{DD}$, $v_{DD}$+IR, and $V_{DD}$. The channel potential $V_{CHANNEL}$ will be equal to $V_{DD}$, and the body voltage $V_{BODY}$ will also be substantially zero. For both the selected and partially selected devices, the overdrive applied to the respective gates does not overstress the oxide or other features of the addressed NMOS transistors, even though the gate to body voltage is higher than $V_{DD}$. Transistor reliability therefore remains uncompromised.

Although various embodiments set forth above generally identify the hard and easy directions based on the relative sequential ordering of a resistive sense element and a switching device of a cell, such is not necessarily limiting. Rather, it is contemplated that various memory cell constructions may alternatively have an "easy" and a "hard" direction based on some other feature of the cell. It will be understood that the various embodiments disclosed herein are equally suitable for these other types of memory cells in obtaining read current symmetry without compromising cell reliability.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. An apparatus comprising:
    a resistive sense memory (RSM) cell comprising an RSM element coupled to a switching device, the switching device comprising a plurality of terminals; and
    a control circuit which compensates for asymmetric write characteristics of the RSM cell by limiting a range of voltage differentials across said terminals to be equal to or less than a magnitude of a source voltage applied to the switching device to provide bi-directional write currents of substantially equal magnitude through the RSM element.

2. The apparatus of claim 1, wherein the switching device is sized to break down when a gate-drain voltage differential across the switching device exceeds the source voltage, and wherein during a write in a hard direction the control circuit pre-charges a drain of the switching device to the source voltage prior to applying a first gate control voltage to a gate of the switching device greater than the source voltage, and wherein during a write in an easy direction the control circuit applies a second gate control voltage to the gate equal to or less than the source voltage.

3. The apparatus of claim 2, wherein the RSM cell is characterized as a first RSM cell, and wherein during said write in the hard direction the control circuit further pre-charges additional control lines to the source voltage, said additional control lines connected to additional RSM cells coupled to the gate of the first RSM cell.

4. The apparatus of claim 1, wherein the control circuit operates to, when writing in a first direction through the RSM element, pre-charge a first control line to the source voltage, and then apply a first gate control voltage to the switching device to pass a first write current from the pre-charged first control line, through the switching device and to the RSM element to program said element in a first resistive state, the first gate control voltage selected to be greater than the source voltage by a delta voltage value equal to a voltage drop across the RSM element.

5. The apparatus of claim 4, wherein the control circuit further operates to, when writing in a second direction through the RSM element, apply a second gate control voltage to the switching device to pass a second write current from a second control line, through the RSM element and to the switching device to program the RSM element in a second resistive state, wherein the second gate control voltage is less than the first gate control voltage, and wherein a magnitude of the second write current is nominally equal to a magnitude of the first write current.

6. The apparatus of claim 5, wherein the control circuit directs the first write current to flow through the RSM cell from the first control line to the second control line, and directs the second write current to flow through the RSM cell from the second control line to the first control line.

7. The apparatus of claim 1, wherein the range of voltage differentials include the source voltage applied to a first terminal of the switching device, a gate control voltage applied to a second terminal of the switching device, and a delta voltage value at a third terminal of the switching device, wherein the delta voltage value is equal to a voltage drop across the RSM element, and wherein the gate control voltage is equal to the source voltage and the delta voltage value.

8. The apparatus of claim 7, wherein the switching device is characterized as a field effect transistor with a gate, a drain and a source, wherein the source voltage is applied to the drain and the gate control voltage is applied to the gate.

9. The apparatus of claim 1, wherein the RSM cell is characterized as a spin-torque transfer random access memory (STRAM) cell and the RSM element is characterized as a magnetic tunneling junction (MTJ).

10. The apparatus of claim 1, wherein the RSM cell is characterized as a resistive random access memory (RRAM) cell and the RSM element is characterized as a multi-layer, filament generating resistive element.

11. A method comprising:
    providing a resistive sense memory (RSM) cell comprising an RSM element coupled to a switching device; and
    compensating for asymmetric write characteristics of the RSM cell by:
        pre-charging a first control line to a source voltage; and
        applying a first gate control voltage to the switching device to pass a first write current from the pre-charged first control line, through the switching device and to the RSM element to program a first resistive state, the first gate control voltage selected to be greater than the source voltage by a delta voltage value equal to a voltage drop across the RSM element.

12. The method of claim 11, wherein the compensating step further comprises:
    applying a second gate control voltage to the switching device to pass a second write current from a second control line, through the RSM element and to the switching device to program a second resistive state, wherein the second gate control voltage is less than the first gate control voltage, and wherein a magnitude of the second write current is nominally equal to a magnitude of the first write current.

13. The method of claim 12, wherein the first write current flows through the RSM cell from the first control line to the second control line, and wherein the second write current flows through the RSM cell from the second control line to the first control line.

14. The method of claim 11, wherein the RSM cell is characterized as a first RSM cell in a semiconductor memory array comprising an adjacent second RSM cell with a second RSM element and a second switching device, wherein the second switching device is connected to the pre-charged first control line, wherein the second RSM element is connected to a third control line not connected to the first RSM cell, wherein the pre-charging step further comprises pre-charging the third control line to the source voltage, and wherein the applying step comprises concurrently applying the first gate control voltage to the first and second RSM cells, wherein the pre-charging of the third control line prevents a changing of a programmed state of the second RSM cell.

15. The method of claim 11, wherein the delta voltage value is substantially equal to the source voltage.

16. The method of claim 11, wherein the switching device is characterized as a field effect transistor with a gate, a drain and a source, wherein the first control line is connected to the drain, the RSM element is connected to the source, and the gate control voltage is applied to the gate.

17. The method of claim 11, wherein the transistor is sized such that the first gate control voltage is sufficient to structurally damage the transistor when the first gate control voltage is applied to the gate and no voltage is applied to the drain.

18. A semiconductor memory comprising:
   an array of memory cells each comprising a resistive sense memory (RSM) element coupled to a switching device; and
   a control circuit adapted to apply bi-directional write currents of substantially equal magnitude through a selected memory cell of the array in a hard direction and an easy direction, respectively, the control circuit applying a first gate control voltage to a gate of the switching device greater than a source voltage in said hard direction, the control circuit applying a second gate control voltage to said gate equal to or less than the source voltage in said easy direction.

19. The semiconductor memory of claim 18, in which the switching device is sized to break down when a gate-drain voltage differential across the switching device exceeds the source voltage.

20. The semiconductor memory of claim 18, in which during application of said write current in said hard direction the control circuit pre-charges the drain of the switching device to the source voltage prior to applying the first gate control voltage to the gate of the switching device.

* * * * *